United States Patent [19]

Smernos

[11] 4,185,139
[45] Jan. 22, 1980

[54] FILLER FOR A GLASS-CERAMIC MATERIAL COMPRISING CaF$_2$ GRANULES OVERCOATED WITH A SILICON DIOXIDE FILM

[75] Inventor: Stauros Smernos, Stuttgart, Fed. Rep. of Germany

[73] Assignee: International Standard Electric Corporation, New York, N.Y.

[21] Appl. No.: 866,093

[22] Filed: Dec. 30, 1977

[51] Int. Cl.$^2$ .......................... B32B 19/04; C09C 1/02
[52] U.S. Cl. ..................................... 428/404; 106/306; 106/308 B; 427/220; 427/387
[58] Field of Search ............. 428/404; 106/306, 308 B

[56] References Cited

U.S. PATENT DOCUMENTS

| | | | |
|---|---|---|---|
| 3,946,134 | 3/1976 | Sherman | 428/404 |
| 3,956,005 | 5/1976 | Sugakara et al. | 428/404 |
| 3,990,860 | 11/1976 | Fletcher et al. | 428/404 |
| 4,046,586 | 9/1977 | Ulkmarn et al. | 428/404 |
| 4,068,038 | 1/1978 | Montiglia et al. | 428/404 |

FOREIGN PATENT DOCUMENTS

1380361  1/1975  United Kingdom ..................... 428/404

*Primary Examiner*—James C. Cannon
*Attorney, Agent, or Firm*—John T. O'Halloran; Peter C. Van Der Sluys

[57] ABSTRACT

A granular filler for a glass-ceramic material, particularly low-melting solder glass for encapsulating semiconductors is provided by coating grains of a filler material with an oxide film that interacts with the glass-ceramic material at temperatures below 400° C.

1 Claim, No Drawings

FILLER FOR A GLASS-CERAMIC MATERIAL COMPRISING CaF₂ GRANULES OVERCOATED WITH A SILICON DIOXIDE FILM

BACKGROUND OF THE INVENTION

1. Field of the Invention

The present invention relates to a granular filler for a glass-ceramic material and in particular for a low melting solder glass for encapsulating semiconductors.

2. Description of the Prior Art

A filler of this kind is known from German Published Patent Application (DT-OS) 2,533,687. Many other materials, such as alkaline-earth halides, are also suitable for use as fillers.

By admixing a filler to a glass-ceramic material, the coefficient of expansion of the solder glass can be changed. The fillers given in German Published Patent Application 2,533,687, e.g. $SiO_2$, have a low coefficient of expansion ($SiO_2$:$5 \cdot 10^{-7}/°K.$) and are therefore suited to reducing the coefficient of expansion of the solder glass.

When a glass-ceramic material is used, e.g., when a semiconductor device is encapsulated directly in a solder glass, it is important that the coefficients of expansion of the solder glass and the semiconductor substrate be approximately equal, with a difference between the coefficients of expansion of $\pm 5 \cdot 10^{-7}/°K.$ being still permissible.

For example, when a gold-wire-bonded transistor alloyed onto a copper strip is used, the encapsulation of such a transistor must take place at temperatures below 378° C., since above this temperature, gold and silicon form a etectic soluble in the glass melt. A solder glass which permits encapsulation below 378° C. is given below.

A disadvantage is that there is a great difference between the coefficients of expansion of this solder glass ($100-120 \cdot 10^{-7}/°K.$) and of the copper ($160 \cdot 10^{-7}/°K.$). This may result in the formation of cracks in the encapsulation. Therefore, either the coefficient of expansion of the solder glass must be adapted to that of the copper, or a different supporting material must be found to replace the copper. For the supporting material, alloys are known (e.g. an Fe-Ni-Co alloy with a high Fe content) whose coefficients of expansion agree relatively well with that of the solder glass. However, these alloys are much more expensive than copper and have a poor thermal conductivity.

As mentioned earlier, the coefficient of expansion of a solder glass can be changed by admixing a filler.

SUMMARY OF THE INVENTION

It is the object of the invention to provide a filler which can be admixed to a low-melting glass-ceramic material and change the coefficient of expansion of the glass-ceramic material so as to adapt it to that of the semiconductor substrate.

This object is achieved by covering the grains of the filler with an oxide film which interacts with the glass-ceramic material at temperatures below 400° C. The grains of the filler may be covered by immersing them in a solution of an oxide forming compound, and allowing the solvent to evaporate at room temperature leaving the grains covered with an oxide-forming compound, the covered grains are thereafter heated to form an oxide film on the surface of the grains.

Through the novel filler, the coefficient of expansion of the glass-ceramic material used to encapsulate semiconductor devices can be adapted to that of the supporting material for the semiconductor device.

DESCRIPTION OF THE PREFERRED EMBODIMENT

The invention will now be described by way of example with respect to the encapsulation in a solder glass of a gold-wire-bonded transistor alloyed onto a copper strip. The solder glass consists of the following constituents (molar ratios are given):

$PbO:ZnO:B_2O_3 \approx 2:1:1$;
$PbF_2:Tl_2O:SiO_2 \approx 2:1:1$;
$(PbO + ZnO + B_2O_3):(PbF_2 + Tl_2O + SiO_2)$ between 8:1 and 10:1).

Since the coefficient of expansion of copper is $160 \cdot 10^{-7}/°K.$, and that of the solder glass $100-120 \cdot 10^{-7}/°K.$, the coefficient of expansion of the filler must be greater than $160 \cdot 10^{-7}/°K.$, for only in that case can a resultant coefficient of expansion of $160 \cdot 10^{-7}/°K.$ be achieved.

It is a prerequisite for the use of a filler in a solder glass that the glass melt interact with the filler. How this interaction takes place is still not quite clear. It is assumed, however, that the glass melt chemically attacks the filler to a slight degree. It must be borne in mind that during the encapsulation, the temperature of the glass melt must not exceed the eutectic temperature of a gold-silicon alloy.

Experiments with known fillers have produced unsatisfactory results at these temperatures.

Good results were obtained with a granular filler whose grains are covered with an approximately 1 μm thick $SiO_2$ film. The filler used was $CaF_2$, whose coefficient of expansion is $180 \cdot 10^{-7}/°K.$ To manufacture this novel filler, the $CaF_2$ grains are immersed in a solution of an organosilicon compound. Organosilicon compounds are known from, inter alia, "Rompps Chemie-Lexikon", 7th Edition, 1975, Franck'sche Verlagsbuchhandlung, Stuttgart. The solvent used may be an organic one. After the solvent has evaporated at room temperature, the $CaF_2$ grains, covered with the organosilicon compound, are heated, whereby the desired $SiO_2$ film is formed thereon.

The pulverized solder glass is so mixed with the $CaF_2$ grains covered with an $SiO_2$ film that the resulting mixture contains 10% by weight of filler.

During the melting of the solder glass mixed with the filler, the $SiO_2$ film on the $CaF_2$ grains reacts with the glass melt. The resultant coefficient of expansion is approximately equal to that of the copper. It is particularly advantageous that the novel filler does not affect the fluidity of the solder glass.

What is claimed is:

1. A granular filler for a low-melting glass-ceramic solder glass useful for the modification of the coefficient of expansion of the glass-ceramic solder glass upon melting to render it compatible with the coefficient of expansion of semiconductor substrates comprising:

$CaF_2$ granules the surfaces of which are overcoated with a silicon dioxide film capable of interacting with the glass-ceramic solder glass at temperatures below 400° C.

* * * * *